(12) United States Patent
Manger et al.

(10) Patent No.: US 10,020,387 B2
(45) Date of Patent: Jul. 10, 2018

(54) METHOD FOR MANUFACTURING A BIPOLAR JUNCTION TRANSISTOR

(71) Applicant: Infineon Technologies Dresden GmbH, Dresden (DE)

(72) Inventors: Dirk Manger, Dresden (DE); Stefan Tegen, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/452,780

(22) Filed: Mar. 8, 2017

(65) Prior Publication Data

US 2017/0317198 A1    Nov. 2, 2017

(30) Foreign Application Priority Data

May 2, 2016   (DE) .................. 10 2016 207 536

(51) Int. Cl.

| | |
|---|---|
| *H01L 27/082* | (2006.01) |
| *H01L 27/102* | (2006.01) |
| *H01L 29/737* | (2006.01) |
| *H01L 29/06* | (2006.01) |
| *H01L 29/08* | (2006.01) |
| *H01L 29/16* | (2006.01) |
| *H01L 29/165* | (2006.01) |
| *H01L 29/36* | (2006.01) |
| *H01L 29/66* | (2006.01) |
| *H01L 29/10* | (2006.01) |

(52) U.S. Cl.
CPC ...... *H01L 29/7378* (2013.01); *H01L 29/0649* (2013.01); *H01L 29/0817* (2013.01); *H01L 29/0826* (2013.01); *H01L 29/165* (2013.01); *H01L 29/1608* (2013.01); *H01L 29/36* (2013.01); *H01L 29/66068* (2013.01); *H01L 29/66242* (2013.01); *H01L 29/1004* (2013.01)

(58) Field of Classification Search
CPC . H01L 29/7378; H01L 29/73; H01L 29/0817; H01L 29/0826
USPC .......................................... 257/586
See application file for complete search history.

(56) References Cited

U.S. PATENT DOCUMENTS 6,649,482 B1 * 11/2003 Naem ................. H01L 29/0817
                                                    257/E21.371
2012/0056305 A1    3/2012 Kuo et al.
(Continued)

*Primary Examiner* — Theresa T Doan
(74) *Attorney, Agent, or Firm* — Harrity & Harrity, LLP

(57) ABSTRACT

Embodiments provide a method for manufacturing a bipolar junction transistor, comprising:
  providing a semiconductor substrate comprising a buried layer of a first conductive type;
  doping the semiconductor substrate in a collector implant region, to obtain a collector implant of the first conductive type extending parallel to a surface of the semiconductor substrate and from the surface of the semiconductor substrate to the buried layer;
  providing a base layer of a second conductive type on the surface of the semiconductor substrate, the base layer covering the collector implant;
  providing a sacrificial emitter structure on the base layer, wherein a projection of an area of the sacrificial emitter structure is enclosed by an area of the collector implant; and
  partially counter doping the collector implant through an area of the base layer surrounding an area of the base layer that is covered by the sacrificial emitter structure.

21 Claims, 11 Drawing Sheets

(56) References Cited

U.S. PATENT DOCUMENTS

2013/0119516 A1    5/2013  Harame et al.
2014/0332927 A1\*  11/2014  Feilchenfeld ..... H01L 29/66287
                                                                    257/565

\* cited by examiner

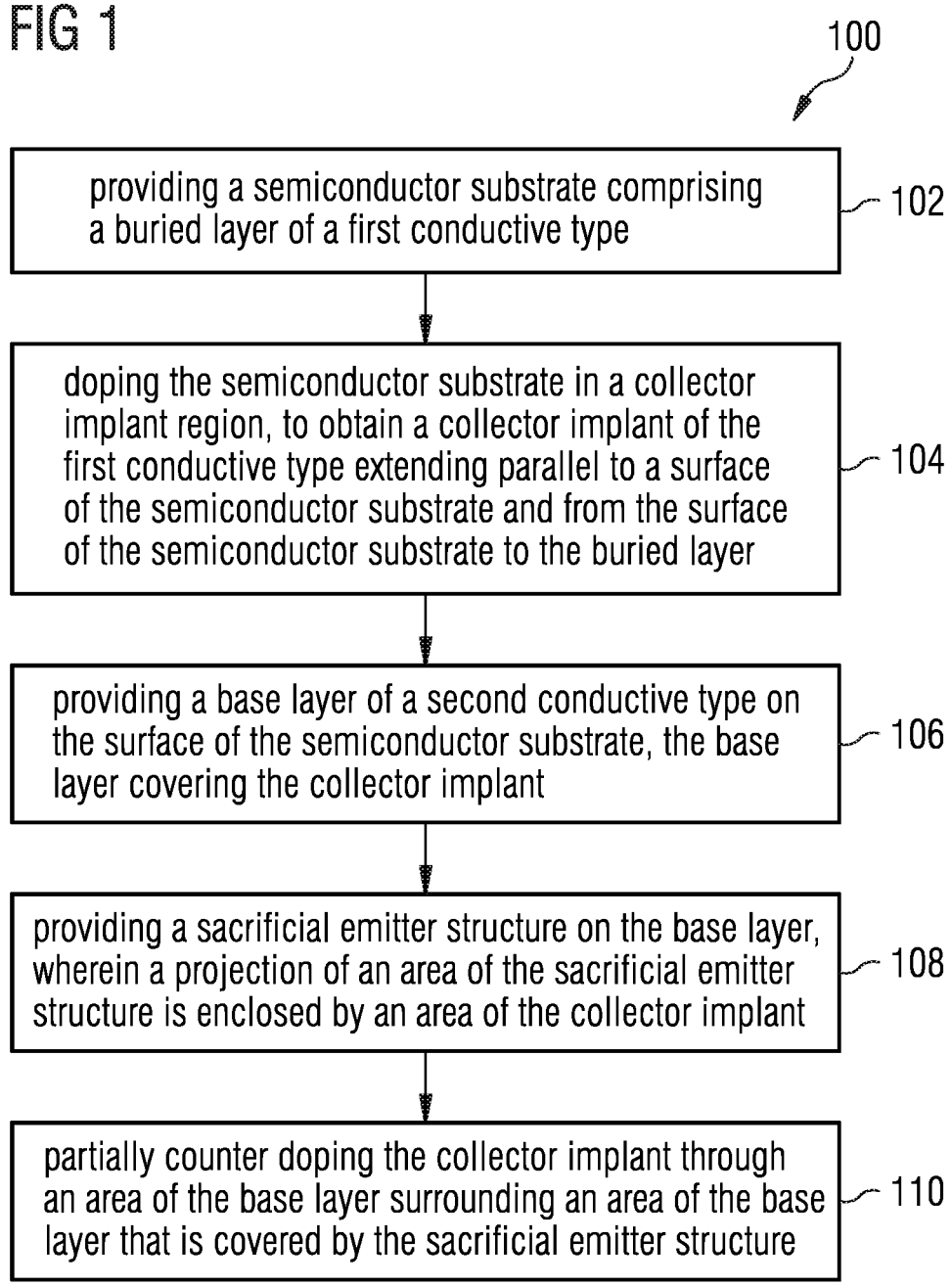

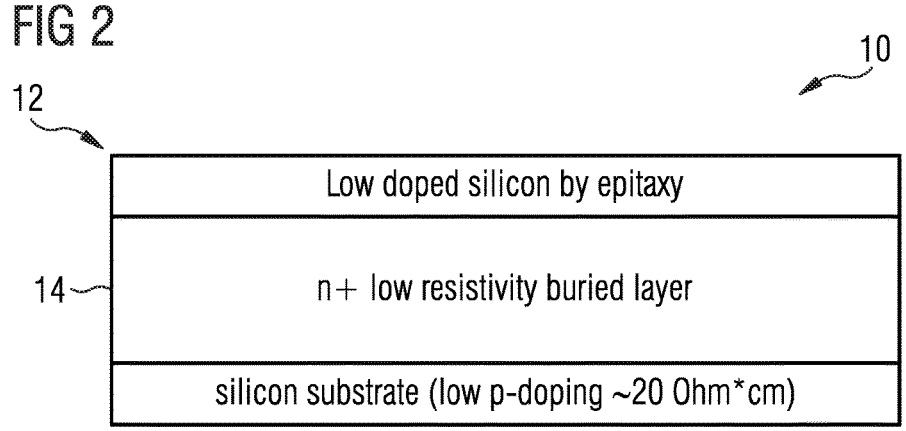
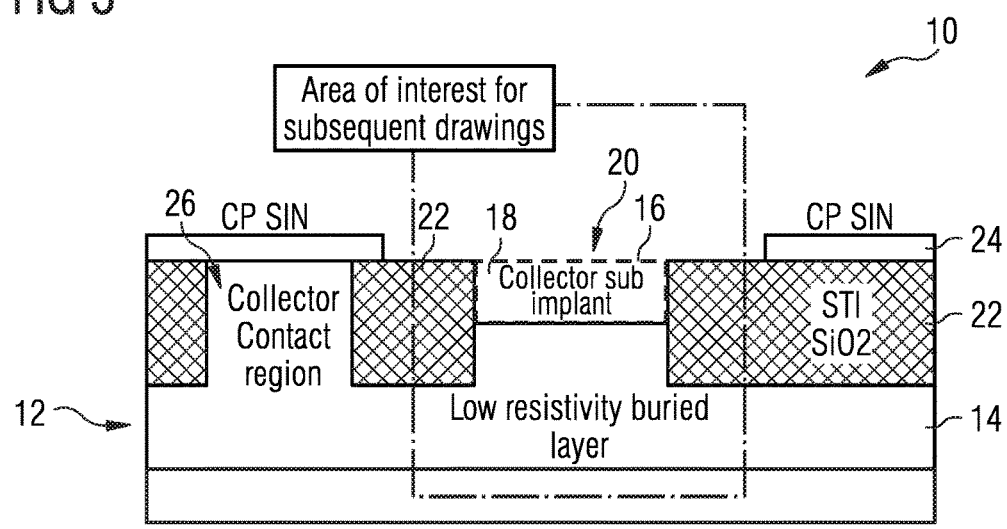

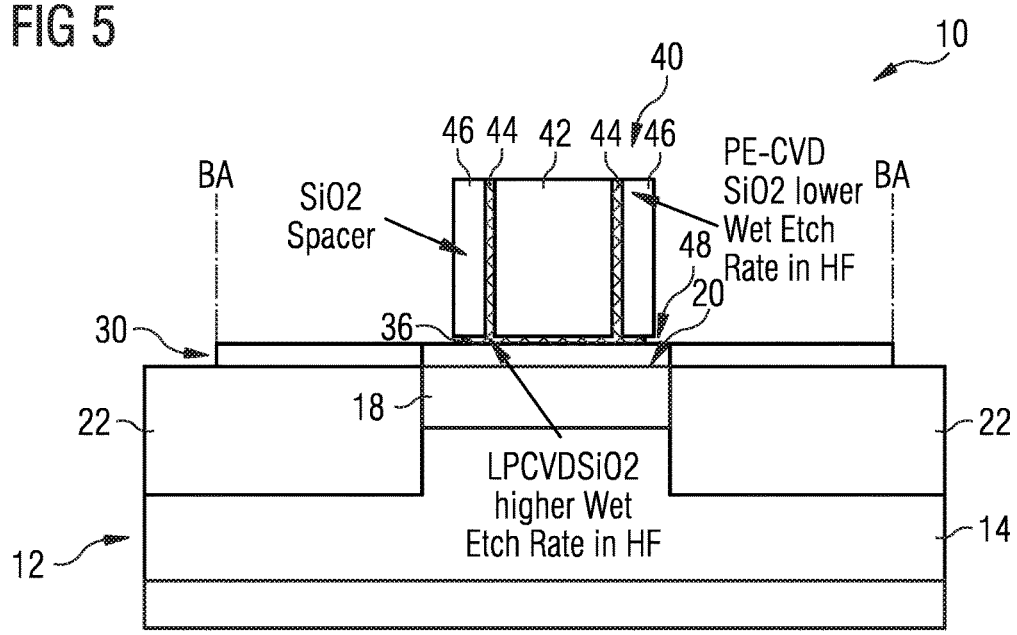
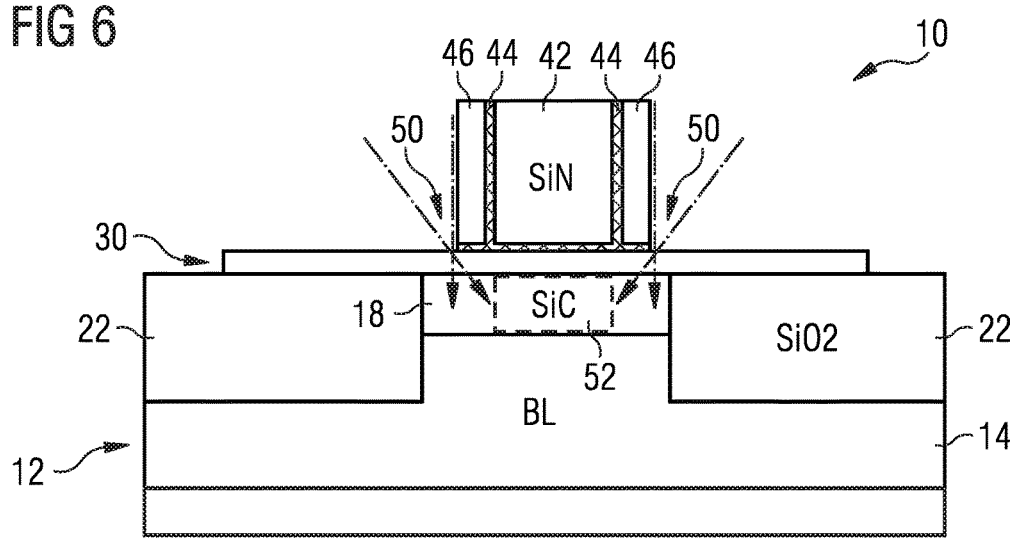

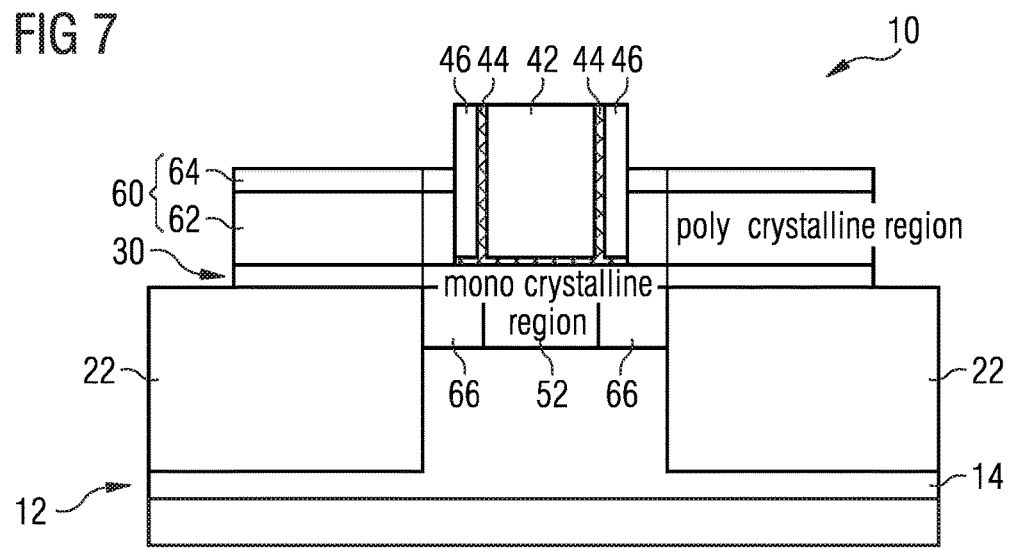
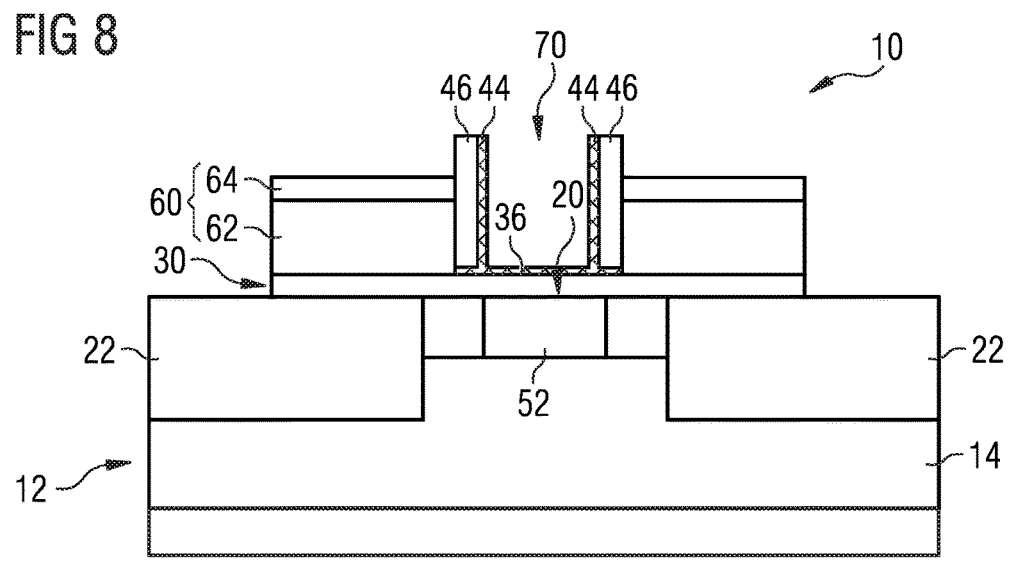

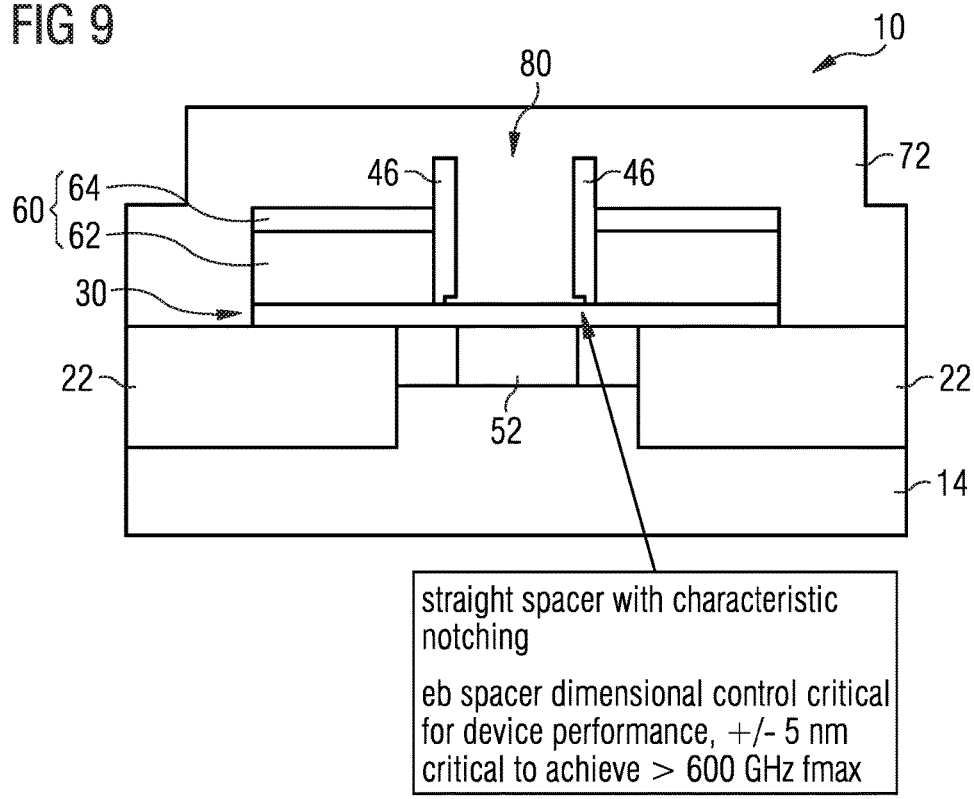
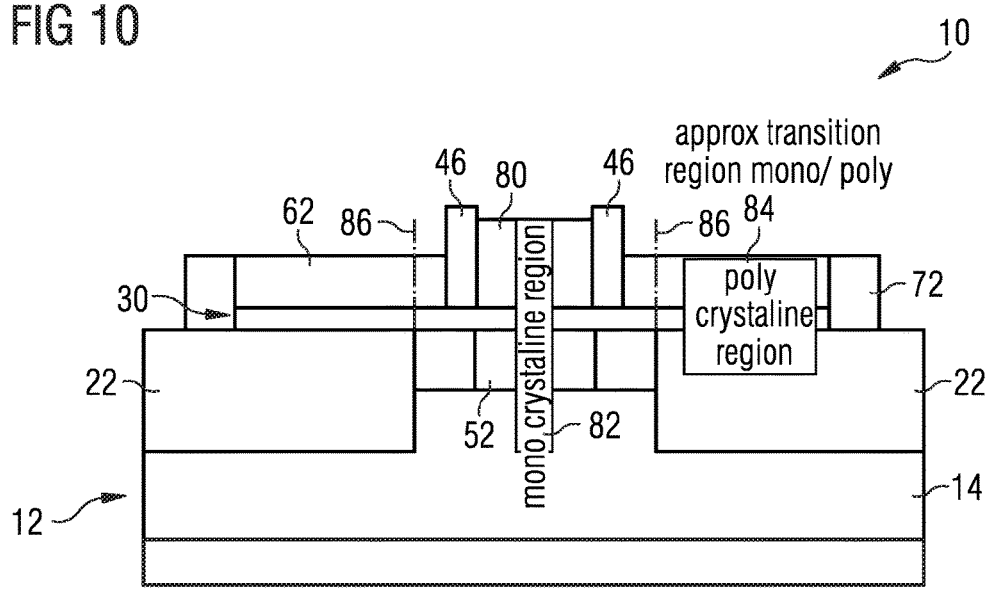

Experimental and simulated boron profiles for spike anneal with a peak temperature of (a) 1000° C and (b) 1050° C, respectively.

METHOD FOR MANUFACTURING A BIPOLAR JUNCTION TRANSISTOR

RELATED APPLICATION

This application claims priority under 35 U.S.C. § 119 to German Patent Application No. 102016207536.5, filed on May 2, 2016, the content of which is incorporated by reference herein in its entirety.

TECHNICAL FIELD

Embodiments relate to a method for manufacturing a bipolar junction transistor. Further embodiments relate to a bipolar junction transistor. Some embodiments relate to a SiGe Hetero-junction-Bipolar-Transistor (HBT) device architecture for improved performance (e.g., fMax>500 GHz) at reduced process complexity (e.g., compared to a fMax=400 GHz class architecture).

BACKGROUND

HBT transistors are used as signal generators in RADAR (RAdio Detection And Ranging) products, driving maximum switching frequencies of in excess of 400 GHz in order to fulfill the demand for better spatial and velocity resolution at reduced power consumption. It is desired to increase the maximum available switching frequency (fMax) by 50% or more. However, this increase cannot be achieved with currently available, production-worthy device concepts. In order to increase switching speed, the parasitic elements of the device have to be reduced or eliminated beyond the current device architecture.

While increasing performance of the devices, cost of production is to be reduced, e.g. by factor two. The cost adder of the current architecture is mainly owed to four additional lithography levels (EW (emitter window), BA (base link), DA (emitter contact landing pad), EA (bipolar transistor to metallization contact structure)) using expensive deep-UV (ultra violet) lithographic processes and associated structuring processes. In order to reduce cost, the process flow has to be simplified, critical process tolerances need to be reduced or eliminated in order to improve yield potential.

In other words, HBT (Hetero junction Bipolar Transistor) devices, that are used for applications operating in the multi GHz to THz range have to meet a number of competing and conflicting requirements with respect to switching speeds (figures of merit e.g. fMax, ringo-delay tau) with small tolerances, while keeping manufacturing cost low and yield high. The maximum oscillation frequency (fMax) is strongly influenced by the parasitic lead in resistance of the base region and parasitic overlap capacitances of the base/collector diode. High switching speeds also require steep doping profiles, limiting the additional thermal budget after the realization of the HBT device structure.

SUMMARY OF THE INVENTION

Embodiments provide a method for manufacturing a bipolar junction transistor. The method comprises:
providing a semiconductor substrate comprising a buried layer of a first conductive type;
doping the semiconductor substrate in a collector implant region, to obtain a collector implant of the first conductive type extending parallel to a surface of the semiconductor substrate and from the surface of the semiconductor substrate to the buried layer;
providing a base layer of a second conductive type on the surface of the semiconductor substrate, the base layer covering the collector implant;
providing a sacrificial emitter structure on the base layer, wherein a projection of an area of the sacrificial emitter structure is enclosed by an area of the collector implant; and
partially counter doping the collector implant through an area of the base layer surrounding an area of the base layer that is covered by the sacrificial emitter structure.

Further embodiments provide a bipolar junction transistor, comprising a semiconductor substrate comprising a buried layer of a first conductive type; a collector of the first conductive type extending parallel to a surface of the semiconductor substrate and from the surface of the semiconductor substrate to the buried layer; a base layer of a second conductive type arranged on the surface of the semiconductor substrate, the base layer covering the collector; and an emitter of the first conductive type arranged on the base layer, wherein the emitter comprises notches arranged directly on the base layer protruding under isolation spacers, wherein a projection of an area of the emitter is enclosed by an area of the collector; wherein the collector is self-aligned to the emitter.

BRIEF DESCRIPTION OF THE DRAWINGS

FIG. 1 shows a flowchart of a method for manufacturing a bipolar junction transistor according to an embodiment;

FIG. 2 shows a schematic cross-sectional view of the bipolar junction transistor during manufacturing after the step of providing the semiconductor substrate;

FIG. 3 shows a schematic cross-sectional view of the bipolar junction transistor during manufacturing after the step of doping the semiconductor substrate in a collector implant region, to obtain a collector implant of the first conductive type;

FIG. 5 shows a schematic cross-sectional view of the bipolar junction transistor during manufacturing after the step of providing the sacrificial emitter structure;

FIG. 6 shows a schematic cross-sectional view of the bipolar junction transistor during manufacturing after the step of partially counter doping the collector implant through an area of the base layer surrounding an area of the base layer that is covered by the sacrificial emitter structure, to obtain a collector that is self-aligned to the sacrificial emitter structure;

FIG. 7 shows a schematic cross-sectional view of the bipolar junction transistor during manufacturing after providing a base contact layer on the base layer;

FIG. 8 shows a schematic cross-sectional view of the bipolar junction transistor during manufacturing after removing the sacrificial emitter, to obtain an emitter window;

FIG. 9 shows a schematic cross-sectional view of the bipolar junction transistor during manufacturing after providing an emitter layer of the first conductive type in the emitter window to obtain an emitter;

FIG. 10 shows a schematic cross-sectional view of the bipolar junction transistor during manufacturing after partially removing the emitter layer at least up to the base contact layer, to obtain an emitter in the emitter window;

DETAILED DESCRIPTION

Figure 4:
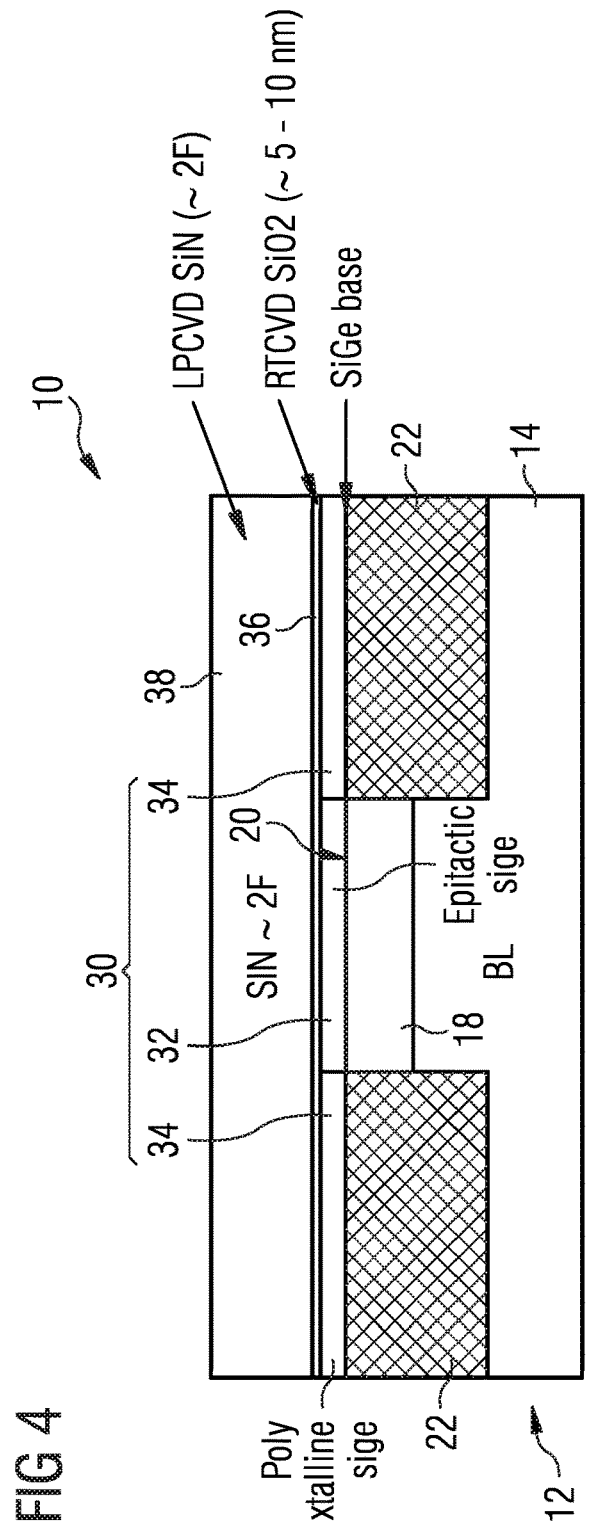
FIG. 4 shows a schematic cross-sectional view of the bipolar junction transistor during manufacturing after the step of providing a base layer of the second conductive type on the surface of the semiconductor substrate and after an intermediate step of the step of providing the sacrificial emitter structure on the base layer.

Below, embodiments of the present invention will subsequently be discussed referring to the enclosed figures, wherein identical reference numerals are provided to objects or elements having the same or similar function so that the description thereof is mutually applicable and interchangeable.

FIG. 1 shows a flowchart of a method 100 for manufacturing a bipolar junction transistor according to an embodiment. In a first step 102 a semiconductor substrate is provided that comprises a buried layer of a first conductive type. In a second step 104 the semiconductor substrate is doped in a collector implant region, to obtain a collector implant of the first conductive type extending parallel to a surface of the semiconductor substrate and from the surface of the semiconductor substrate to the buried layer. In a third step 106 a base layer of a second conductive type is provided on the surface of the semiconductor substrate, the base layer covering the collector implant. In a fourth step 108 a sacrificial emitter structure is provided on the base layer, wherein a projection of an area of the sacrificial emitter structure is enclosed by an area of the collector implant. In a fifth step 110 the collector implant is partially counter doped through an area of the base layer surrounding an area of the base layer that is covered by the sacrificial emitter structure.

Subsequently, embodiments of the method 100 for manufacturing a heterojunction bipolar transistor device resulting in a device HBT structure with characteristic structural features are described. As will become clear from the following discussion, the process flow is less complex, as measured in lithography-levels used, compared to other concepts.

Note that for simplicity reasons, in the Figs. the option to use a collector grown by selective epitaxy has been omitted.

FIG. 2 shows a schematic cross-sectional view of the bipolar junction transistor 10 during manufacturing after the step 102 of providing the semiconductor substrate 12. As shown in FIG. 2, the semiconductor substrate 12 comprises a buried layer 14 of the first conductive type. The semiconductor substrate 12 can be of a second conductive type.

For example, the first conductive type can be a n-type semiconductor, i.e. a semiconductor material having free electrons as charge carriers, wherein the second conductive type can be a p-type semiconductor, i.e. a semiconductor material having holes as charge carriers. Naturally, the first conductive type also could be a p-type semiconductor, wherein the second conductive type could be a n-type semiconductor.

In the following description it is assumed, that the first conductive type can be a n-type semiconductor, wherein the second conductive type can be a p-type semiconductor.

In detail, the semiconductor substrate 12 can be a low p-doped (e.g., ~20 Ohm*cm) silicon substrate. The buried layer 14 can be a high n-doped (n+) low resistivity buried layer.

Providing 102 the semiconductor substrate 12 can comprise implanting the buried layer (e.g., As) 14. Further, the providing 102 the semiconductor substrate 12 can comprise driving and annealing (oxidative) the buried layer 14 and overgrowing the n+ buried layer 14 by undoped silicon epitaxy, to obtain a low doped silicon layer 16 on the buried layer 14.

Further, the semiconductor substrate 12 can comprise at least one out of trench isolation, device implants and MOS-transistor gates (e.g., provided by Gox (gate oxide), poly silicon deposition, lithography and patterning) (not shown in FIG. 2).

FIG. 3 shows a schematic cross-sectional view of the bipolar junction transistor 10 during manufacturing after the step 104 of doping the semiconductor substrate 12 in a collector implant region 16, to obtain a collector implant 18 of the first conductive type (e.g., n-type). The collector implant 18 may extend parallel to a surface 20 of the semiconductor substrate 12 and from the surface 20 of the semiconductor substrate 12 to the buried layer 14.

The semiconductor substrate 12 can further comprise trenches 22 extending from the surface 20 of the semiconductor substrate 12 into a depth direction of the substrate 12. In that case, doping the semiconductor substrate 12 can comprise doping the semiconductor substrate 12 in a collector implant region 16 (that is arranged) between the trenches.

Further, as shown in FIG. 3, doping the semiconductor substrate 12 can comprise doping the semiconductor substrate 12 in a collector implant region 18 that completely extends between the trenches 22, to obtain a collector implant 20 completely extending between the trenches 22.

Moreover, doping the semiconductor substrate 12 can comprise providing a cap layer (e.g., CMOS protection layer—typically a thin conformal silicon nitride layer shielding the cmos region from being affected by bipolar processes SiN) 24 and partly opening the cap layer 24, to obtain an opening that defines the collector implant region 16.

In detail, the trenches 22 can be STI (Shallow Trench Isolation) SiO2 trenches. Further, the step 104 can comprise depositing a CMOS protection layer (e.g., a 40 nm SiN layer, e.g., obtained using LPCVD (Low-Pressure Chemical Vapor Deposition)) 24, using lithography to expose HBT region (CP (CMOS Protection Line)), patterning by wet etch through SiO2, depositing a mask by HDP (High Density Plasma), providing a shallow retrograde n-implant (e.g. P, As) as collector sub implant for optimized collector doping profile, exposing a collector contact region 26, and implanting a collector sinker (e.g. n++P, As).

In the following description of FIGS. 4 to 13, it is focused on an area of interest indicated by the dashed rectangle in FIG. 3.

FIG. 4 shows a schematic cross-sectional view of the bipolar junction transistor 10 during manufacturing after the step 106 of providing a base layer 30 of the second conductive type (e.g., p-type) on the surface 20 of the semiconductor substrate 12 and after an intermediate step of the step 108 of providing the sacrificial emitter structure on the base layer 30.

As shown in FIG. 4, the base layer 30 can be provided on the surface 20 of the semiconductor substrate 12 (or, more precisely, on the surface of the collector implant 18 and, optionally, on the surface of the trenches 22) such that the base layer 30 extends (completely) over the collector implant 18 and optionally also over the trenches 22.

Providing the base layer 30 can comprise epitaxially growing the base layer 30 on the surface 20 of the semiconductor substrate 12 at least in an area adjacent to the collector implant 18.

For example, as indicated in FIG. 4, the base layer 30 can be a SiGe base layer comprising an epitactic SiGe portion 32 in an area adjacent to the collector implant 18, and a poly-crystalline SiGe portion 34 in an area adjacent to the trenches 22.

The SiGe base 30 can comprise a Si buffer of, e.g., 5 nm, a SiGe layer of, e.g., 20 nm (incl. boron doping), and a Si cap layer of, e.g., 10 nm, (incl. partial boron doping). The Si cap layer can be used to non-selectively seal edges towards the trenches (STI (Shallow Trench Isolation)).

The step 108 of providing the sacrificial emitter structure can comprise providing an isolation layer 36 on the base layer 30 and providing a sacrificial emitter layer 38 on the isolation layer 36.

For example, the isolation layer 36 can be obtained using a RTCVD (Rapid Thermal Chemical Vapor Deposition) SiO2 deposition (e.g., 5 nm). The sacrificial emitter layer 38 can be obtained using a LPCVD (Low Pressure Chemical Vapor Deposition) SiN deposition (e.g., of 2 F, wherein 1 F is the minimal lithographic feature size, e.g., "90 nm").

FIG. 5 shows a schematic cross-sectional view of the bipolar junction transistor 10 during manufacturing after the step 108 of providing the sacrificial emitter structure 40. As shown in FIG. 5, the sacrificial emitter structure 40 is provided on the base layer 30 such that a projection of an area (e.g., ground area, i.e. the area of the emitter structure 40 adjacent to the base layer 30) of the sacrificial emitter structure (onto the collector implant 18) is enclosed by an area (e.g., surface area 20) of the collector implant 18.

Providing the sacrificial emitter structure 40 may comprise partially removing the sacrificial emitter layer 38 (see FIG. 4), to obtain a sacrificial emitter 42, wherein a projection of an area (e.g., ground area, i.e. the area of the emitter 42 adjacent to the base layer 30) of the sacrificial emitter 42 is enclosed by the area (e.g., surface area 20) of the collector implant 18.

For example, the sacrificial emitter layer 38 can be partially removed by a SiN dry etch with low damage to base 30 (e.g., selective to SiO2 and end pointed). Residuals in the CMOS region can be removed by a selective etch with respect to the CMOS Protection Line (CP). Base patterning can be performed by lithography and selective Si dry etch with respect to dielectric material (BL (base link)).

Further, providing the sacrificial emitter structure 40 may comprise providing lateral isolation layers 44 on the sidewalls of the sacrificial emitter 40.

For example, the lateral isolation layers 44 can be provided using a PECVD (Plasma Enhanced Chemical Vapor Deposition) SiO2 deposition (low wet etch rate).

Moreover, providing the sacrificial emitter structure 40 may comprise partially removing the isolation layer 36 such that the isolation layer 36 protrudes under the sacrificial emitter 42 and such that a projection of an area of the isolation layer 36 is enclosed by the area of the collector implant 18.

In addition, providing the sacrificial emitter structure 40 may comprise providing an isolation spacer 46 on the isolation layer 36 and the lateral isolation layers 44, to obtain the sacrificial emitter structure 40.

In detail, before partially removing the isolation layer 36 a further isolation layer may be provided on the isolation layer 36. The further isolation layer may have a lower etch rate than the isolation layer 36. Therefore, when partially removing the further isolation layer and the isolation layer 36 to obtain the sacrificial emitter structure 40 having the isolation spacer 46 (=patterned further isolation layer) on the isolation layer 36 and the lateral isolation layers 44, notches are formed under the isolation spacer 46 due to the different etch rates.

For example, the isolation layer can be LPCVD SiO2, wherein the further isolation layer can be PECVD SiO2. LPCVD SiO2 has a higher etch rate in HF than PECVD SiO2. In other words, the isolation spacer 46 can be a SiO2 spacer. The isolation spacer 46 can be structured by a SiO2 spacer etch with stop on Si-Cap.

FIG. 6 shows a schematic cross-sectional view of the bipolar junction transistor 10 during manufacturing after the step 110 of partially counter doping the collector implant 18 (see FIG. 5) through an area 50 of the base layer 30 surrounding an area of the base layer that is covered by the sacrificial emitter structure, to obtain a collector 52 that is self-aligned to the sacrificial emitter structure. In other words, the base layer can be (imaginary) divided into a first area and a second area, wherein the first area is the area immediately adjacent to (or abutting) the ground area of the sacrificial emitter structure (or isolation layer 30), wherein the second area is the area immediately surrounding the first area, wherein the collector implant 18 (see FIG. 5) is partially counter doped through the second area 50, to obtain the collector 52.

Embodiments provide an inverse self-aligned sub collector. The sub collector can be made self-aligned to the sacrificial emitter by counter doping the implant 18 through the SiGe (base layer 30) outside the current carrying region.

Target is to reduce the effective n-doping concentration to below 5e17 cm3. Thereby, a C implant can be included to reduce B out diffusion.

The width of the highly doped collector region close to the base (SiC) 52 can be larger than 0,5 times the width of the sacrificial emitter 42 and smaller than 2 times the width of the same emitter 42. This can be achieved by angled implants of the SiC counter doping therefore effectively reducing the remaining, higher doped SiC region which serves as conduction path for electrons from the emitter (see also FIG. 15). An increase of the above described SiC region can be achieved by sizing the EB (emitter base) spacer appropriately.

FIG. 7 shows a schematic cross-sectional view of the bipolar junction transistor 10 during manufacturing after providing a base contact layer 60 on the base layer 30. The base contact layer 60 can be epitaxially grown on the base layer 30. Thereby, the base contact layer 60 may have a mono crystalline region (substantially) adjacent to the counter doped collector implant region (i.e., the region of the collector implant that was counter doped) 66 and a poly crystalline region (substantially) adjacent to the trenches 22.

In detail, the base contact layer 60 can comprise a first base contact layer 62 arranged on the base layer 30 and a second base contact layer 64 arranged on the first base contact layer 62. For example, the first base contact layer 62 can be a selectively highly doped Si epitaxially (EPI) grown layer (~0.6 F) (~760-800° C., DCS (D. C. S.), B2H6), wherein the second base contact layer 64 can be a selectively un-doped Si-cap layer (~0.2 F) (~760-800° C., DCS).

FIG. 8 shows a schematic cross-sectional view of the bipolar junction transistor 10 during manufacturing after removing the sacrificial emitter 42 (see FIG. 7), to obtain an emitter window 70. As shown in FIG. 8, a projection of an area (e.g., ground area, i.e., area of the emitter window 70 (immediately) adjacent to the isolation layer 36) of the emitter window 70 is enclosed by the area (e.g., surface area 10) of the collector implant 52.

For example, and as already indicated above, the sacrificial emitter 42 can comprise SiN. Therefore, the sacrificial emitter can be removed by stripping the SiN from dummy emitter. Further, a simultaneous strip from periphery with stop on remaining SiO2 hardmask (CP (CMOS Protection line) process module) can be performed.

Further, also the isolation layer 36 and the lateral isolation layers 44 can be removed, to obtain an emitter window 70 that protrudes under the isolation spacers 46, wherein a projection of an area (e.g., ground area, i.e., area of the emitter window 70 (immediately) adjacent to the base layer 30) of the emitter window 70 is enclosed by the area (e.g., surface area 20) of the collector implant.

For example, the isolation layer 36 and the lateral isolation layers 44 can comprise RTCVD SiO2. In that case, removing the isolation layer 36 and the lateral isolation layers 44 can comprise performing a DHF (Dilute Hydrofluoric Acid) etch back of RTCVD SiO2 layer inside the emitter window 70 (EB (Emitter Base) spacer thinning accounted for), integrated pre-cleaning of the emitter window 70, and integrated striping of a remaining CP (CMOS Protection line) hard mask.

FIG. 9 shows a schematic cross-sectional view of the bipolar junction transistor 10 during manufacturing after providing an emitter layer 72 of the first conductive type (e.g., n-type) in the emitter window 70 to obtain an emitter 80. Thereby, the emitter layer 72 of the first conductive type can be provided on the base contact layer 60 and in the emitter window 70 such that an overfill of the emitter window 70 is achieved.

For example, an emitter deposition can be performed by differential epitaxy with the following parameters: AS doped ~3e20/cm3; C doped; epitaxy at SiGe base region; thickness ~1F.

As indicated in FIG. 9, the emitter 80 can protrude under the isolation spacers 46 in notches obtained by removing the isolation layer 36 which protruded under the isolation spacers 46. In other words, the part of the emitter 80 that protrudes under the isolation spacers 46 forms a straight spacer with characteristic nothing. A dimensional control of the EB (Emitter Base) spacer is critical for device performance, for example, a spacer of +/−5 nm is critical to achieve maximum frequency of more than 600 GHZ, >600 GHz fmax.

As shown in FIGS. 8 and 9, embodiments provide a double-self aligned emitter.

FIG. 10 shows a schematic cross-sectional view of the bipolar junction transistor 10 during manufacturing after partially removing the emitter layer 72 at least up to the base contact layer 60, to obtain an emitter 80 in the emitter window 70. As indicated in FIG. 10, also the second base contact layer 64 and part of the first base contact layer 62 can be removed during removing the emitter layer 72.

Further, in FIG. 10, a monocrystalline region 82 and a poly crystalline region 84 are indicated. In Addition, doted lines 86 indicate an approximated transition region between the monocrystalline region 82 and the poly crystalline region 84.

For example, a dry recess of emitter poly silicon 72 with end point stop can be performed. Thereby, an end point from emitter clearing from CMOS regions top may be so little that no CMOS spacer is maintained on vertical sidewalls (<0,25 F). For spike anneals, a B doping from base may not extend beyond SiGe peak without C implant, spike anneal amy drive in B~30 nm into mono substrate (1e18 concentration). In addition, a hot phos strip of remaining SiN layer from CP level can be performed.

Figure 11:
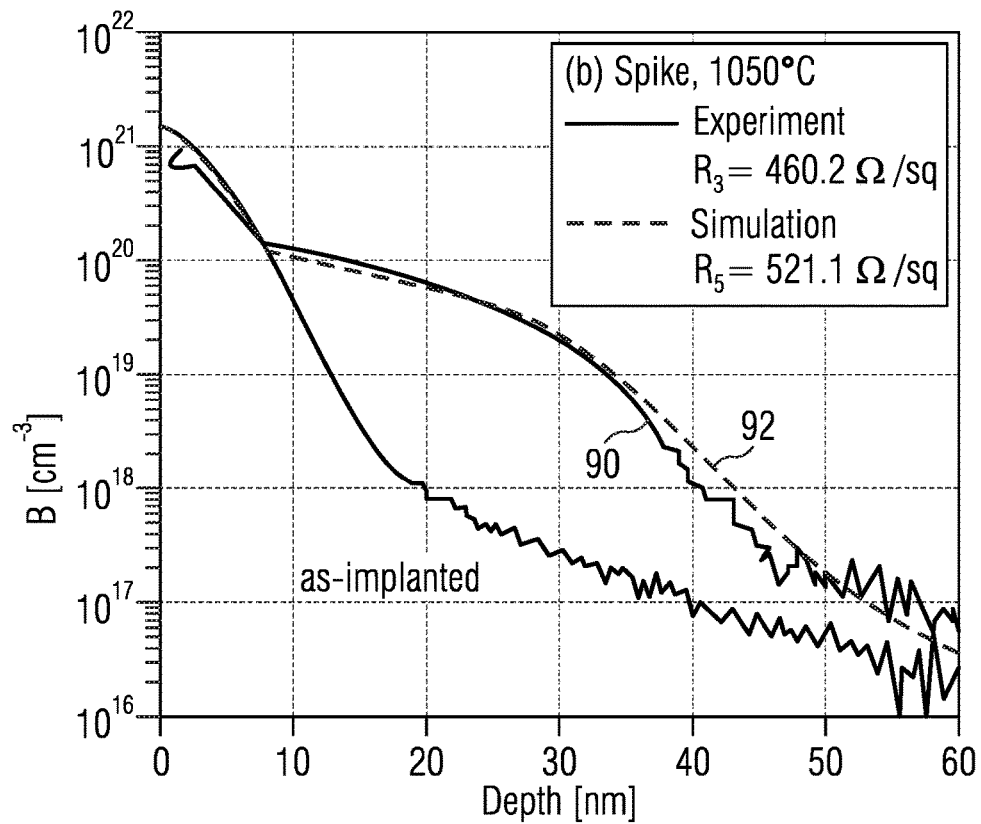
FIG. 11 shows in a diagram a Boron (B) concentration in cm3 plotted over a depth in nm.

FIG. 11 shows in a diagram a Boron (B) concentration in cm3 plotted over a depth in nm. A first curve 90 shows an experimental result (Rs=460.2 Ohm/sq) wherein a second curve 92 shows a simulation result (Rs=521.1 Ohm/sq). Thus, FIG. 11 shows in a diagram experimental and simulated boron profiles for spike anneal with a peak temperature of 1050° C.

Figure 12:
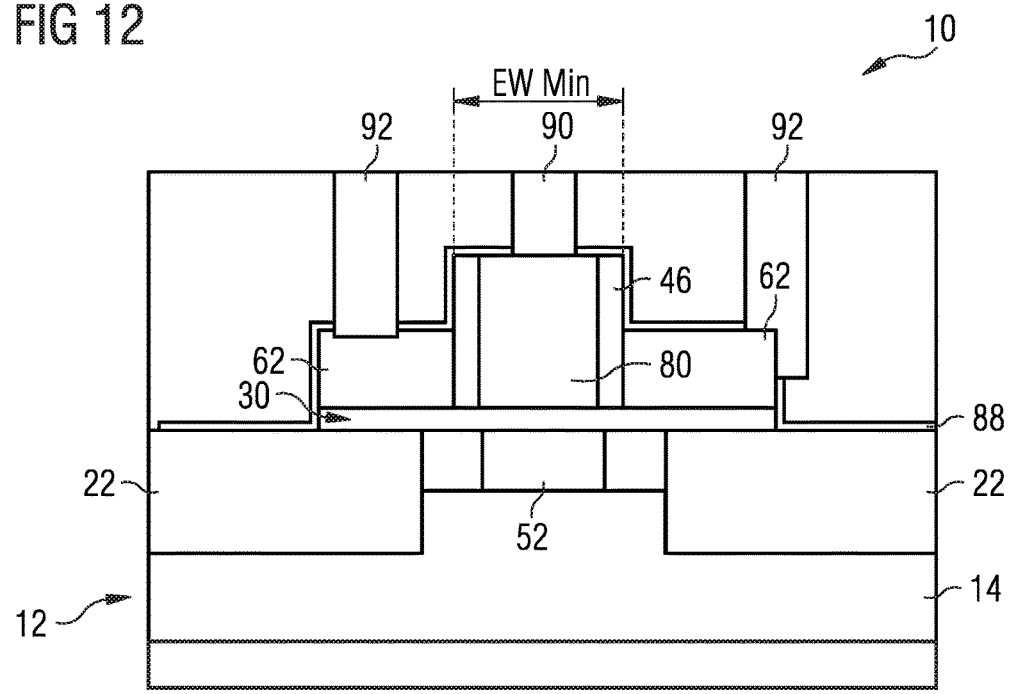
FIG. 12 shows a schematic cross-sectional view of the bipolar junction transistor during manufacturing after providing a barrier layer on the emitter, the first base contact layer and the trenches, and after providing an emitter contact contacting the emitter and base contacts contacting the first base contact layer.

FIG. 12 shows a schematic cross-sectional view of the bipolar junction transistor 10 during manufacturing after providing a barrier layer 88 on the emitter 80, the first base contact layer 62 and the trenches 22, and after providing an emitter contact 90 contacting the emitter 80 and base contacts 92 contacting the first base contact layer 62 (fully landed base contacts). The barrier layer can be a Mid-of-Line "liner", e.g., a thin conformal SiN layer typically 12-25 nm, shielding the device from contamination from the Mid and Backend of Line barrier layer.

In detail, a Mol (Mid-of-Line) liner can be deposited (e.g., 25 nm). Alternatively, a Mol SiO2 can be deposited followed by a CMP (Chemical Mechanical Polishing) step. Further, an EA (bipolar transistor to metallization contact structure) etch with stop on SiN liner can be processed. In addition, a W tungsten-plug (a common contact material in microelectronics, the MOL contact is usually realized with tungsten as main contact material (in addition to a thin Ti/TiN liner)) process can be performed.

The following parameters can be used when manufacturing the bipolar junction transistor 10. The minimal lithographic feature size can be equal to 90 nm (F=90 nm) (ground rule); the EA (bipolar transistor to metallization contact structure) contact dimension can be equal to F at the contacting region to the HBT device (contact bottom) bottom; total overlay tolerances can be assumed to be less than 0.4 F, which is equal to 36 nm; the minimum emitter width (EW min) can therefore be equal to 194 nm.

FIGS. 4 to 12 show embodiments of the manufacturing of a bipolar junction transistor 10 exemplarily having a self-aligned selectively implanted collector NSEG with non-selective epitaxially grown base. Subsequently, embodiments of the manufacturing of a bipolar junction transistor 10 exemplarily having a SA SIC-NSEG base are described with respect to FIGS. 13 to 19.

Thereby, the semiconductor substrate 12 can be provided (step 102) and doped (step 104) to obtain the collector implant 18 as already described with respect to FIGS. 2 and 3. Further, only differences compared to FIGS. 4 to 12 will be described, so that the description of FIGS. 4 to 12 is basically also applicable to the embodiments of the manufacturing of a bipolar junction transistor 10 described with respect to FIGS. 13 to 19.

Figure 13:
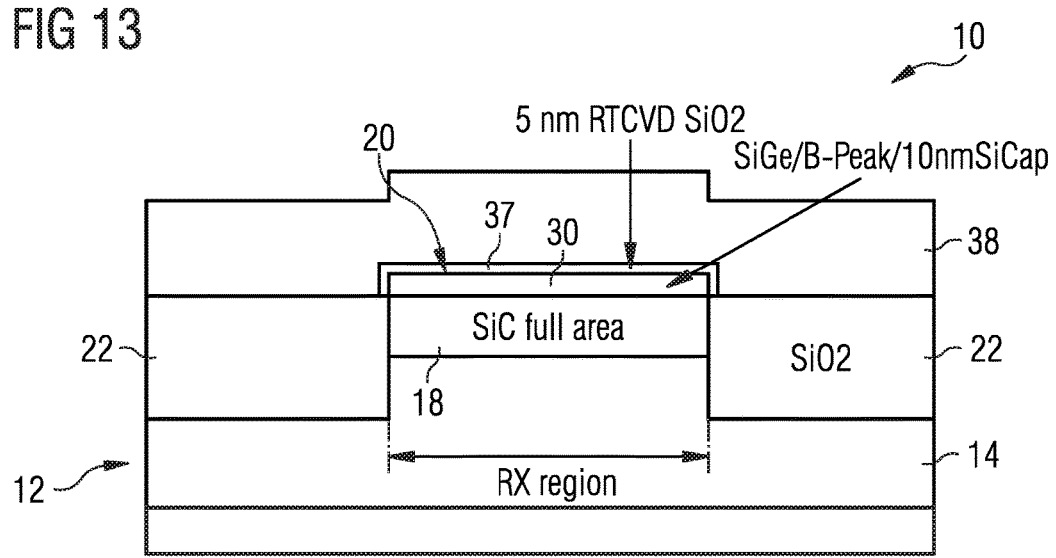
FIG. 13 shows a schematic cross-sectional view of the bipolar junction transistor during manufacturing after the step of providing a base layer of the second conductive type on the surface of the semiconductor substrate and after an intermediate step of the step of providing the sacrificial emitter structure on the base layer.

FIG. 13 shows a schematic cross-sectional view of the bipolar junction transistor 10 during manufacturing after the step 106 of providing a base layer 30 of the second conductive type (e.g., p-type) on the surface 20 of the semiconductor substrate 12 and after an intermediate step of the step 108 of providing the sacrificial emitter structure 38 on the base layer 30.

The collector implant (selective collector implant, SIC) 18 can be done by implanting the entire active area of the HBT device. The collector implant region (active area (AA)) is indicated in FIG. 13 by the dashed lines.

As shown in FIG. 13, the base layer 30 can be provided on the surface 20 of the semiconductor substrate 12 (or, more precisely, on the surface of the collector implant 18) such that the base layer 30 extends (completely) over the collector implant 18.

Providing the base layer 30 can comprise epitaxially growing the base layer 30 on the surface 20 of the semiconductor substrate 12 in an area adjacent to the collector implant 18.

The step 108 of providing the sacrificial emitter structure can comprise providing an isolation layer on the base layer 30 (SiGe/B-Peak/10 nm SiCap) and providing a sacrificial emitter layer 38 (silicon nitride) on the isolation layer 36.

For example, the isolation layer 37 can be obtained using a RTCVD (Rapid Thermal Chemical Vapor Deposition) SiO2 deposition (e.g., 5 nm). The sacrificial emitter layer 38 can be obtained using a LPCVD (Low Pressure Chemical Vapor Deposition) SiN deposition (e.g., of 2 F, wherein 1 F is the minimal lithographic feature size, e.g., "90 nm").

Figure 14:
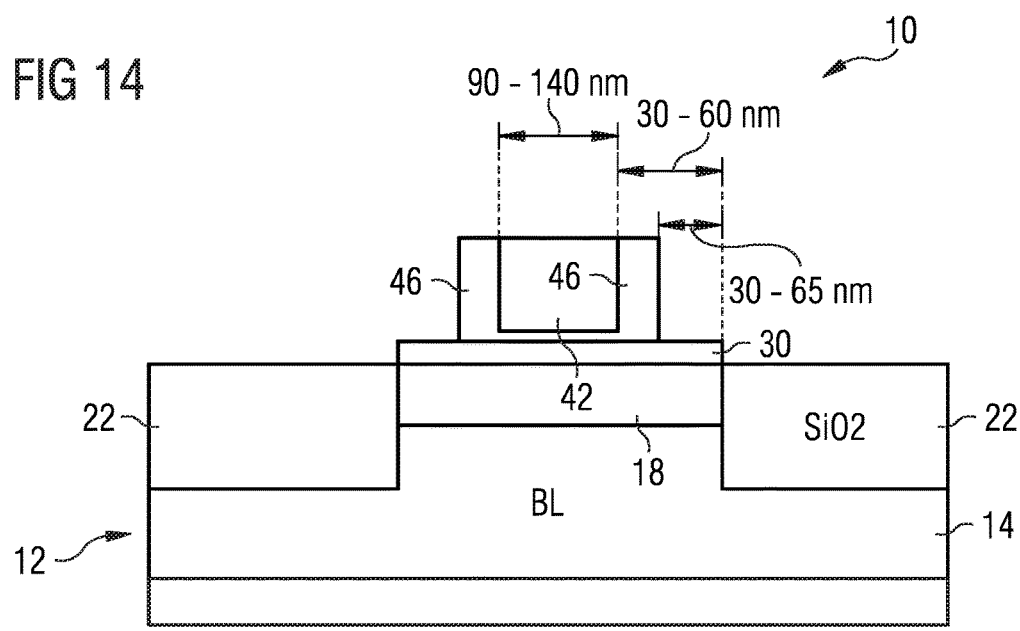
FIG. 14 shows a schematic cross-sectional view of the bipolar junction transistor during manufacturing after the step of providing the sacrificial emitter structure.

FIG. 14 shows a schematic cross-sectional view of the bipolar junction transistor 10 during manufacturing after the step 108 of providing the sacrificial emitter structure 40. Further, in FIG. 14 dimensions of the sacrificial emitter structure 40 and the base layer 30 are indicated, for example, the sacrificial emitter 42 may have a width of 90 to 140 nm, the isolations spacers 46 may have a width of 30 to 60 nm, and the base layer 30 may protrude under the sacrificial emitter structure 40 on both or all sides by 30 to 65 nm.

For example, the sacrificial emitter structure 40 can be obtained by a SiN patterning with stop on SiO2, a SiO2 spacer deposition (double spacer as described above), and a SiO2 spacer etch (as described above).

Figure 15:
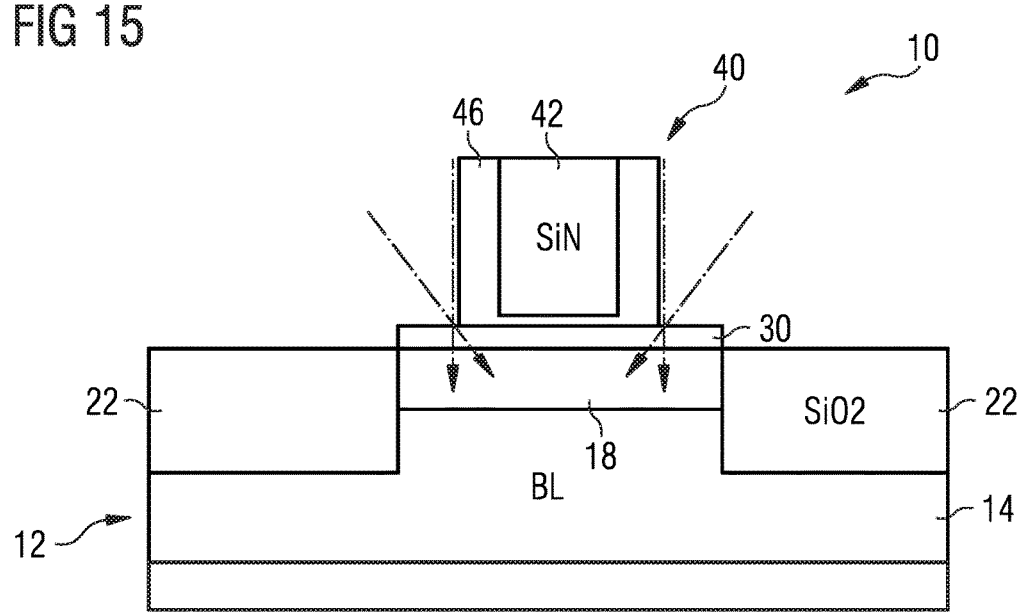
FIG. 15 shows a schematic cross-sectional view of the bipolar junction transistor during manufacturing during the step of partially counter doping the collector implant through an area of the base layer surrounding an area of the base layer that is covered by the sacrificial emitter structure, to obtain a collector that is self-aligned to the sacrificial emitter structure.

FIG. 15 shows a schematic cross-sectional view of the bipolar junction transistor 10 during manufacturing during the step 110 of partially counter doping the collector implant 18 (see FIG. 14) through an area of the base layer 30 surrounding an area of the base layer that is covered by the sacrificial emitter structure 40, to obtain a collector 52 that is self-aligned to the sacrificial emitter structure 40.

Figure 16:
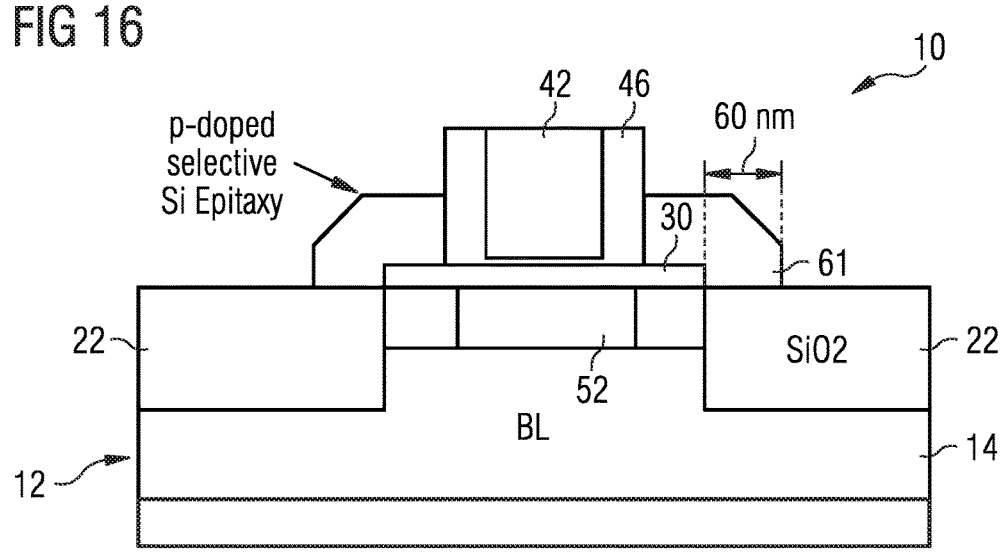
FIG. 16 shows a schematic cross-sectional view of the bipolar junction transistor during manufacturing after providing a base contact layer 60 on the base layer.

FIG. 16 shows a schematic cross-sectional view of the bipolar junction transistor 10 during manufacturing after providing a base contact layer 60 (p-doped) on the base layer 30. The base contact layer 60 can be epitaxially grown on the base layer 30 (selective Si epitaxy or selective high boron (B) doped epitaxy (EPI) having a thickness of, e.g., 60 nm).

Figure 17:
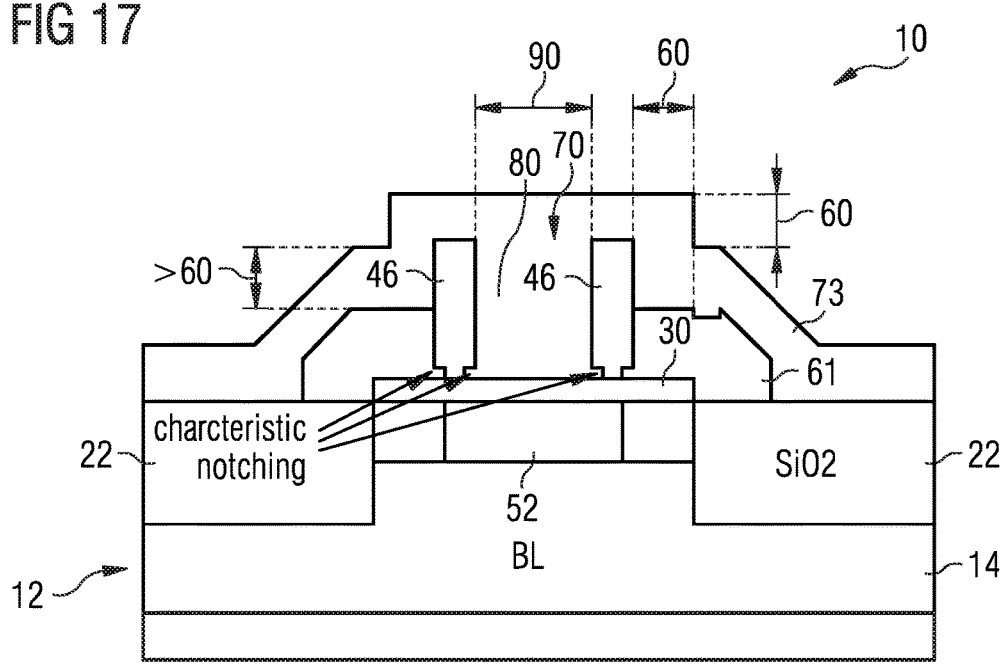
FIG. 17 shows a shows a schematic cross-sectional view of the bipolar junction transistor during manufacturing after removing the sacrificial emitter, to obtain an emitter window, and providing an emitter layer of the first conductive type in the emitter window to obtain an emitter.

FIG. 17 shows a shows a schematic cross-sectional view of the bipolar junction transistor 10 during manufacturing after removing the sacrificial emitter 42 (see FIG. 16), to obtain an emitter window 70, and providing an emitter layer 73 of the first conductive type (e.g., n-type) in the emitter window 70 (conformal highly n-doped emitter deposition) to obtain an emitter 80. Thereby, the emitter layer 73 of the first conductive type can be provided on the base contact layer 61 and in the emitter window 70 such that an overfill of the emitter window 70 is achieved. Further, in FIG. 16 dimensions in nm of the emitter layer 73 are indicated, for example, the emitter layer 73 may have a (minimum) thickness of 60 nm, and the emitter width can be equal to 90 nm.

As shown in FIG. 17, the emitter 80 comprises the same (or similar) characteristic notching as already described above.

Figure 18:
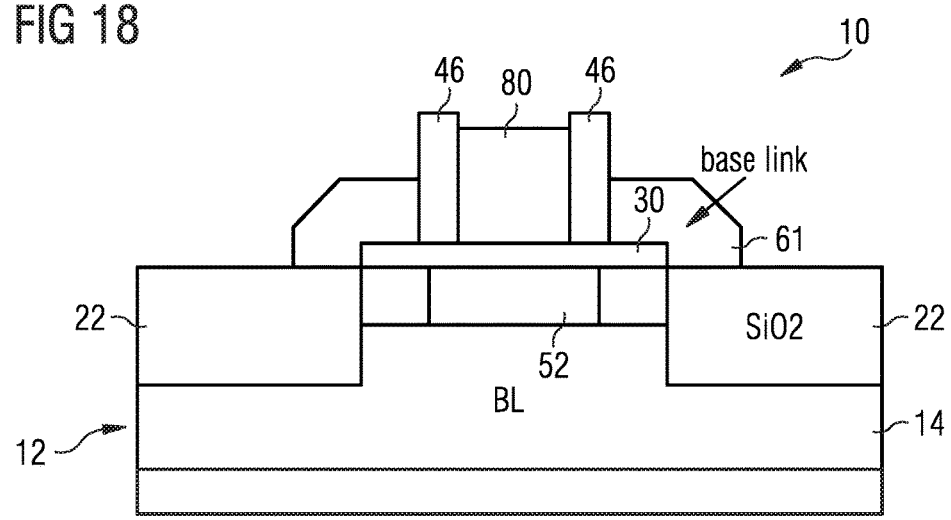
FIG. 18 shows a schematic cross-sectional view of the bipolar junction transistor during manufacturing after partially removing the emitter layer at least up to the base contact layer, to obtain an emitter in the emitter window.

FIG. 18 shows a schematic cross-sectional view of the bipolar junction transistor 10 during manufacturing after partially removing the emitter layer 73 at least up to the base contact layer 61, to obtain an emitter 80 in the emitter window 70.

For example, an isotropic emitter recess by plasma etching can be performed with end-point control to minimize loss.

Figure 19:
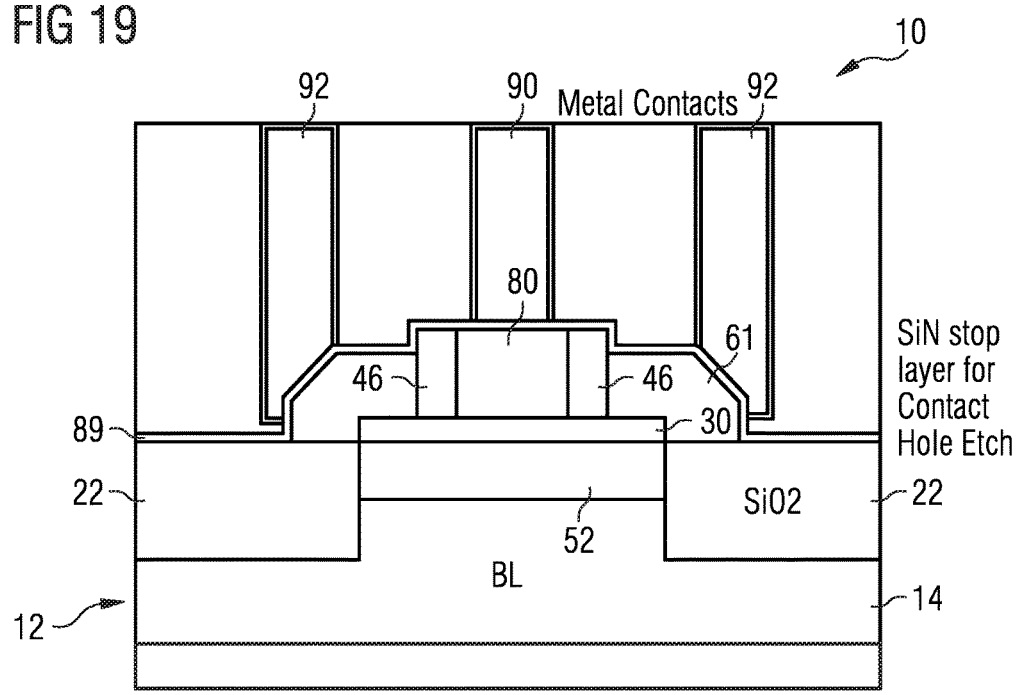
FIG. 19 shows a schematic cross-sectional view of the bipolar junction transistor during manufacturing after providing a SiN stop layer for contact hole etch on the emitter, the base contact layer and the trenches, and after providing an emitter contact contacting the emitter and base contacts contacting the base contact layer.

FIG. 19 shows a schematic cross-sectional view of the bipolar junction transistor 10 during manufacturing after providing a SiN stop layer 89 for contact hole etch on the emitter 80, the base contact layer 61 and the trenches 22, and after providing an emitter contact 90 (metal contact) contacting the emitter 80 and base contacts 92 (metal contacts) contacting the base contact layer 61 (fully landed base contacts).

Embodiments use a 45° rotated substrate material to enable sealing of base link epitaxy against an emitter base (EB) spacer.

Embodiments provide a SIC collector region that is self-aligned to the emitter by counter doping using a dummy emitter as implant mask (scanning resistance measurements by conductive AFM (atomic force microscopy)).

Embodiments provide a vertical emitter/base spacer on a dummy emitter enabling a tight process control.

Embodiments provide a non-selective SiGe base with thin cap as seed layer for selective and highly doped base link epitaxy (this enables higher B concentration in base link region).

Embodiments provide a self-aligned emitter patterning by dry recess—no emitter "wings" covering base link region, minimizing parasitics.

Embodiments provide a sub nominal emitter contact which may be partially landed on the emitter window.

Embodiments provide (for all-selective base link epitaxy, see FIGS. 13 to 19) a base link material showing a typical facetting for epitaxy free growth.

Embodiments provide a simplified HBT architecture with better yield and higher performance potential, having (at least one out of) advantages:
- a self-aligned SiC region to emitter without implantation through SiGe base;
- a simplified replacement-emitter process flow with vertical emitter/base spacer;
- a zero overlap emitter to base-link;
- and optionally (see FIGS. 13 to 19) a lateral dimension of the base link defined by deposition not lithography/etch.

Embodiments provide an array in which each (HBT) element can be individually addressed and characterized.

Embodiments provide a base link self-aligned to AA (active area) region.

Embodiments provide a local collector implant self-aligned to emitter window.

Embodiments provide an emitter/base spacer (dielectric isolation layer) sidewalls vertical with respect to wafer surface at bottom (e.g., having an angle of 85-95° from wafer surface).

Embodiments provide an emitter/base spacer having characteristic "notches" at spacer foot.

Compared to a conventional method for manufacturing a heterojunction bipolar transistor, the method for manufacturing a heterojunction bipolar transistor described herein saves one to two lithography levels.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for manufacturing a bipolar junction transistor, the method comprising:
   providing a semiconductor substrate comprising a buried layer of a first conductive type;
   doping the semiconductor substrate, in a collector implant region, to obtain a collector implant of the first conductive type extending parallel to a surface of the semiconductor substrate and from the surface of the semiconductor substrate to the buried layer;
   providing a base layer of a second conductive type on the surface of the semiconductor substrate, the base layer covering the collector implant;
   providing a sacrificial emitter structure on the base layer, wherein a projection of an area of the sacrificial emitter structure is enclosed by an area of the collector implant; and
   partially counter doping the collector implant through an area of the base layer surrounding an area of the base layer that is covered by the sacrificial emitter structure to generate a counter doped collector implant region of the collector implant.

2. The method according to claim 1, wherein the semiconductor substrate comprises trenches extending from the surface of the semiconductor substrate into a depth direction of the semiconductor substrate; and
   wherein doping the semiconductor substrate comprises doping the semiconductor substrate in a collector implant region between the trenches.

3. The method according to claim 2, wherein doping the semiconductor substrate comprises doping the semiconductor substrate, in a collector implant region that completely extends between the trenches, to obtain a collector implant completely extending between the trenches.

4. The method according to claim 1, wherein doping the semiconductor substrate comprises providing a cap layer and partly opening the cap layer, to obtain an opening that defines the collector implant region.

5. The method according to claim 1, wherein providing the base layer comprises epitaxially growing the base layer on the surface of the semiconductor substrate at least in an area adjacent to the collector implant.

6. The method according to claim 1, wherein providing the sacrificial emitter structure comprises providing an isolation layer on the base layer and providing a sacrificial emitter layer on the isolation layer.

7. The method according to claim 6, wherein providing the sacrificial emitter structure comprises partially removing the sacrificial emitter layer to obtain a sacrificial emitter, wherein a projection of an area of the sacrificial emitter is enclosed by the area of the collector implant.

8. The method according to claim 7, wherein providing the sacrificial emitter structure comprises providing lateral isolation layers on sidewalls of the sacrificial emitter.

9. The method according to claim 8, wherein providing the sacrificial emitter structure comprises partially removing the isolation layer such that the isolation layer protrudes under the sacrificial emitter and such that a projection of an area of the isolation layer is enclosed by the area of the collector implant.

10. The method according to claim 9, wherein providing the sacrificial emitter structure comprises providing an isolation spacer on the isolation layer and the lateral isolation layers, to obtain the sacrificial emitter structure.

11. The method according to claim 1, wherein the method comprises providing a base contact layer on the base layer.

12. The method according to claim 1,
    wherein the sacrificial emitter structure comprises a sacrificial emitter;
    wherein the method further comprises removing the sacrificial emitter to obtain an emitter window, and
    wherein a projection of an area of the emitter window is enclosed by the area of the collector implant.

13. The method according to claim 12, wherein the method comprises providing an emitter layer of the first conductive type in the emitter window to obtain an emitter.

14. The method according to claim 12, wherein the sacrificial emitter structure comprises an isolation layer arranged between the sacrificial emitter and the base layer,
    wherein the isolation layer protrudes under the sacrificial emitter and such that a projection of an area of the isolation layer is enclosed by the area of the collector implant;
    wherein the method further comprises removing the sacrificial emitter and the isolation layer, to obtain an emitter window, and
    wherein the emitter window protrudes under isolation spacers and wherein a projection of an area of the emitter window is enclosed by the area of the collector implant.

15. The method according to claim 12, wherein the method further comprises providing an emitter layer of the first conductive type on a base contact layer and in the emitter window such that an overfill of the emitter window is achieved.

16. The method according to claim 15, wherein the sacrificial emitter protrudes under the base contact layer in notches obtained by removing an isolation layer which protruded under isolation spacers.

17. The method according to claim 16, wherein the method further comprises partially removing the emitter layer at least up to the base contact layer, to obtain an emitter in the emitter window.

18. The method according to claim 17, wherein partially removing the emitter layer at least up to the base contact layer comprises removing the emitter layer at least up to the base contact layer while maintaining the isolation spacers.

19. The method according to claim 17, further comprising:
   providing contacts for contacting the base contact layer and the emitter.

20. The method according to claim 1, wherein doping the semiconductor substrate in the collector implant region comprises doping the semiconductor substrate in the collector implant region without using a lithographic mask.

21. A bipolar junction transistor, comprising
   a semiconductor substrate comprising a buried layer of a first conductive type;
   a collector of the first conductive type extending parallel to a surface of the semiconductor substrate and from the surface of the semiconductor substrate to the buried layer;
   a base layer of a second conductive type arranged on the surface of the semiconductor substrate, the base layer covering the collector; and
   an emitter of the first conductive type arranged on the base layer, wherein the emitter comprises notches arranged directly on the base layer protruding under isolation spacers, wherein a width of the collector is between 0.5 to 2 times the width of the emitter,
   wherein the collector is self-aligned to the emitter, and
   wherein the collector includes a counter doped collector implant region generated by partially doping the collector through an area of the base layer surrounding an area of the base layer that is covered by the emitter.

* * * * *